United States Patent [19]

Birkner et al.

[11] 4,124,899
[45] Nov. 7, 1978

[54] PROGRAMMABLE ARRAY LOGIC CIRCUIT

[75] Inventors: John M. Birkner, Santa Clara; Hua-Thye Chua, Cupertino, both of Calif.

[73] Assignee: Monolithic Memories, Inc., Sunnyvale, Calif.

[21] Appl. No.: 799,509

[22] Filed: May 23, 1977

[51] Int. Cl.² .......................................... H03K 19/20
[52] U.S. Cl. .................................... 364/716; 307/207
[58] Field of Search ........................ 235/152, 156, 164; 307/207; 340/166 R, 900; 364/716

[56] References Cited

U.S. PATENT DOCUMENTS

| | | | |
|---|---|---|---|
| 3,983,538 | 9/1976 | Jones | 235/152 X |
| 3,987,286 | 10/1976 | Muehldorf | 235/152 |
| 4,037,089 | 7/1977 | Horninger | 235/152 |

OTHER PUBLICATIONS

H. Fleisher et al., "Reconfigurable Machine," IBM Tech. Disclosure Bulletin, vol. 16, No. 10, Mar. 1974, pp. 3342-3344.
J. E. Elliott et al., "Array Logic Processing," IBM Tech. Disclosure Bulletin, vol. 16, No. 2, Jul. 1973, pp. 586-587.

*Primary Examiner*—David H. Malzahn
*Attorney, Agent, or Firm*—Limbach, Limbach & Sutton

[57] ABSTRACT

Programmable array logic circuitry is disclosed wherein the outputs from a field programmable AND gate array are connected, non-programmably, to specified OR gates. For greater architectural and operational flexibility, registered outputs, internal feedback to the AND gate array, input/output pin interchangeability, and means for allowing performance of arithmetical, as well as logic, operations, are provided.

21 Claims, 24 Drawing Figures

PROGRAMMABLE ARRAY LOGIC CIRCUIT

BACKGROUND OF THE INVENTION

Fusable links used in bipolar PROMS (Programable Read-Only Memories) have given the digital systems designer the ability to "write on silicon." In little more than a few seconds, an algorithm, a process, or a boolean transfer function can be permanently provided in the regular structure of an integrated circuit (IC) read-only memory.

PROMs are useful for many purposes including microprogram stores for high speed processors and controllers, non-volatile program stores for minicomputers and microprocessors, and high speed character generation and look up tables.

More recently, programmable integrated circuits have been extended to logic circuit arrays. These are sometimes referred to as PLAs (Programmable Logic Arrays) and FPLAs (Field Programmable Logic Arrays). FPLAs, in contrast to earlier mask-programmable circuits, can be programmed away from the place they are manufactured. Any problems in a programmed design that are discovered can be corrected simply by programming a new FPLA and discarding the old one. If the particular application has high enough volumes to cost justify it, a mask can be designed subsequently so that mask-programmable arrays can be made.

PLAs are used in the implementation of random logic networks, data routing, code converters, instruction decoders, state sequences, and a variety of other functions. For a general discussion of PLAs and FPLAs, reference is made to Electronic Design, Vol. 18, Sept. 1, 1976, "PLAs or $\mu$Ps? At Times They Compete, and At Other Times They Cooperate", pp. 24–30.

Existing FPLAs comprise an array of logical AND and OR gates which can be programmed for a specific function. Each output function is the sum (logical OR) of selected products (logical ANDs) where each product is the product of selected polarities of selected inputs.

FPLAs can be programmed so that (1) any input line can be connected to any AND gate input and (2) any of the products (ANDs) can be summed by any of the OR gates. This is accomplished by providing a programmable array or matrix (1) between the circuit inputs and the AND gate inputs and (2) between the output of the AND gates and the inputs of the OR gates, respectively. The FPLA is then programmed by blowing or not blowing the fusible links connecting the conductors of the two arrays much the same way as PROMs are programmed. Examples of such FPLAs are Signetic Models 82S100 and 82S101.

Existing FPLAs as described above, while useful in many applications, have certain disadvantages. First, the size of the IC chip is quite large, due to the use of two programmable arrays per FPLA. This means lower yields, greater costs, and larger IC packages.

Secondly, the flexibility of such FPLAs is limited. They are limited as to the number of inputs, speed, and perhaps most importantly, architecture. Existing FPLAs are very limited in terms of the logical and arithmetical operations they can perform.

SUMMARY OF THE INVENTION

It is therefore an object of the invention to provide improved field programmable circuit arrays;

Another object of the invention is to provide an improved field programmable logic circuit array which is smaller in chip size and less costly to fabricate and package;

Another object of the invention is to provide improved field programmable logic circuit arrays with improved architectural design and function;

Another object of the invention is to provide a family of field programmable logic arrays to give maximum flexibility for circuit design and implementation;

Yet another object of the invention is to provide field programmable circuit arrays which permit arithmetical as well as logical circuit functions.

In accordance with the present invention, an improved FPLA, hereinafter referred to as a programmable array logic (PAL), comprises a single programmable array or matrix of circuit inputs and the inputs to a plurality of AND gates (product terms). Outputs from subgroups of AND gates, in turn, are nonprogrammably connected as inputs to individual, specified OR gates (sum of the products).

By making the AND gate inputs programmable, i.e. selectable by the designer, while having the OR gate inputs nonprogrammable, some design flexibility is sacrificed. However, the reduction in IC chip size for the PAL more than makes up for the slight reduction in flexibility. Smaller chip size means greater yields and hence lower costs. Smaller chip size also means that smaller, more convenient packaging can be used. For example, a package size of approximately 300 mils wide by 1000 mils long with 20 pins is easily accomplished. This compares with the 600 mils by 1400 mils package size, and 28 pins, for existing FPLAs of comparable circuit components and function.

In accordance with another aspect of the present invention, PALs are provided having greater design and operational flexibility than existing FPLAs. This is accomplished through improved architectural design.

One improved architectural feature is the use of registered outputs with feedback. Registers are provided at OR gate outputs which allows temporary storage of the OR gate outputs. Additionally, a feedback path from each such register to the AND gate array is provided. This combination forms a state sequencer which can be programmed to execute elementary sequences such as count up, count down, shift, skip, and branch.

In accordance with another feature of the invention, a feedback path is provided back to the AND gate array from the output of OR gates. This allows the OR gate outputs to be sent back to the AND gate array at the same time they are provided to the output pins. Additionally, programmable means are provided to selectively enable or disable the OR gate outputs. When enabled, the OR gate output is the PAL output. When disabled, the output pin can be used as an input pin and the feedback path serves as another PAL input to the AND gate array.

The use of internal PAL feedback paths gives flexibility to the designer. It also reduces the number of external PAL connections. This has the salutorious effect of increasing the number of inputs to the product terms without increasing the number of pins.

The OR gate enable/disable feature allows greater flexibility in providing the ratio of inputs and outputs. In the static case, by disabling OR gates, more inputs to the PAL is provided. In the dynamic case, this feature provides a bidirectional pin for operations such as shifting.

In accordance with another object of the invention the PAL of the present invention is provided with a combination of exclusive OR gates (XOR) and additional OR logic circuitry at the input to the AND gate array. This permits PAL circuitry to perform arithmetic as well as logical circuit operations.

BRIEF DESCRIPTION OF THE DRAWINGS

FIGS. 6A-6I show the uncompleted PAL circuit of FIG. 1 in a variety of configurations.

DESCRIPTION OF THE PREFERRED EMBODIMENTS

Figure 1:
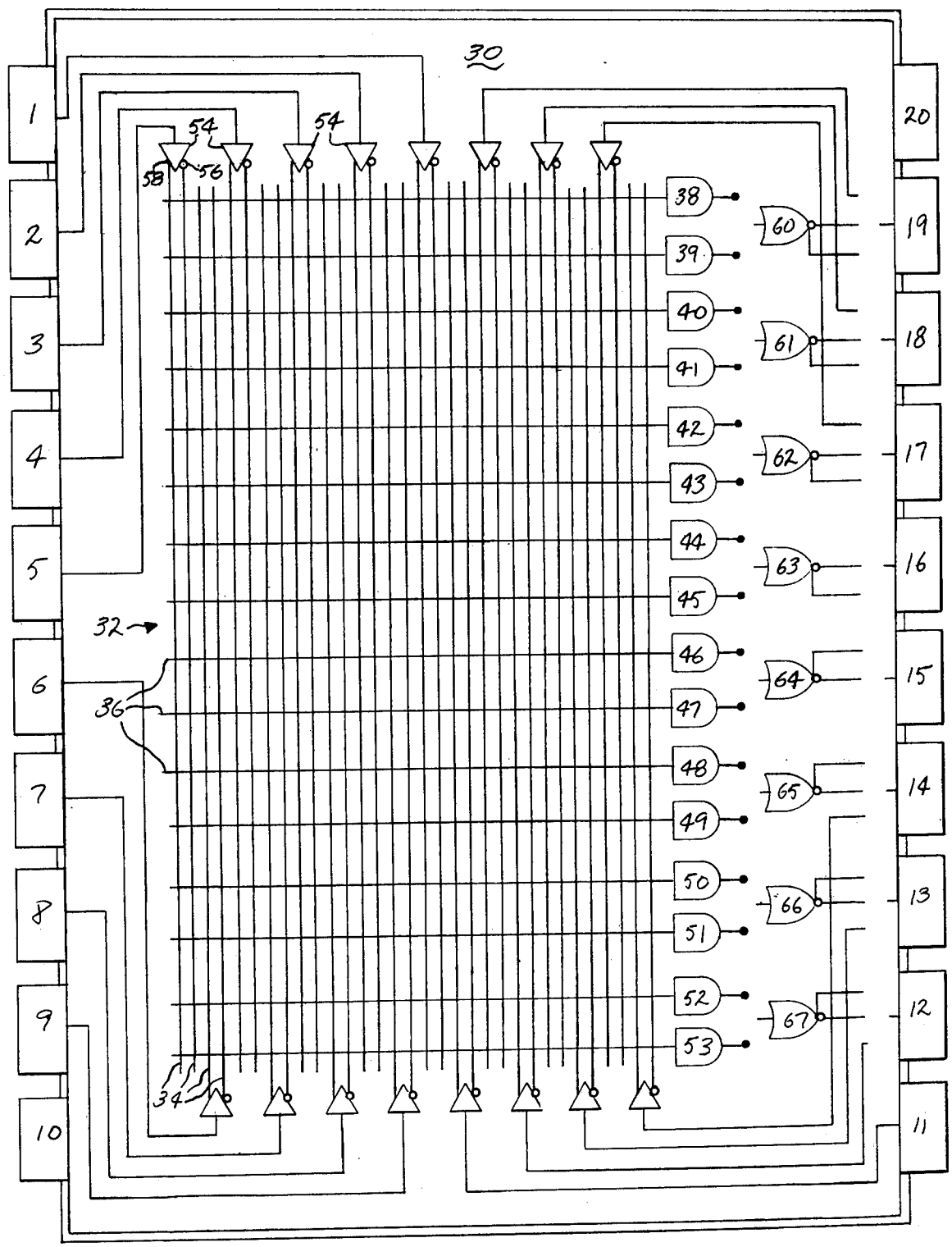
FIG. 1 is a schematic illustration of one embodiment of an unprogrammed and uncompleted Programmable Array Logic (PAL) circuit in accordance with the present invention.

FIG. 1 is a schematic illustration of one embodiment of an unprogrammed and uncompleted Programmable Array Logic (PAL) 30 in accordance with the present invention. As is explained subsequently, this basic arrangement can be used to provide a whole series of circuit configurations each of which in turn is individually programmable by the user. PAL 30 is arranged generally as it is physically configured in an actual, packaged IC. Twenty pins, identified by blocks 1-20, provide inputs and outputs to the PAL 30.

A programmable matrix or array 32 comprises input lines 34, and conductors 36, which are inputs to a plurality of logical AND gates 38-53. Input drivers 54 provide two outputs: an inverted output 56 and non-inverted output 58.

Shown unconnected to the outputs of AND gates 38-53 are a plurality of OR gates 60-67. The manner of their connection with AND gates 38-53 will be discussed subsequently. Of importance, however, is that as finally fabricated for use by the circuit designer, each output from each of the AND gates 38-53 is directly and nonprogrammably connected to an individual one of OR gates 60-67. Thus, the basic PAL 30 architecture comprises a programmable AND gate array feeding a fixed set of OR gates.

Figure 2:
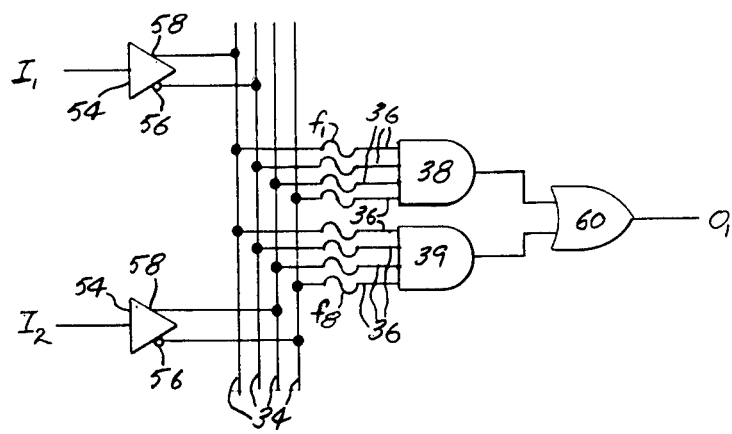
FIG. 2 is a more detailed schematic diagram of the PAL circuit of FIG. 1.

FIG. 2 is a more detailed schematic diagram of a part of PAL circuit 30 of FIG. 1, including AND gates 38 and 39, whose outputs are connected as inputs to OR gate 60. Inputs $I_1$ and $I_2$ are applied to pins 1 and 2. The output of OR gate 60, $O_1$, is provided at pin 19. Each of the inputs 36 to AND gates 38 and 39 are connected through a fuse to an input line 34. Thus fuses $f_1$-$f_4$ are provided for AND gate 38, and fuses $f_5$-$f_8$ for AND gate 39. By either blowing or not blowing individual fuses $f_1$-$f_8$, different inputs can be provided at the input to AND gates 38 and 39.

In the schematic of FIG. 2, the output is the familiar sum of products and can be expressed as:

$$O_1 = [((I_1 \cdot f_1) + \bar{f}_1) \cdot ((\bar{I}_1 \cdot f_2) + \bar{f}_2) \cdot ((I_2 \cdot f_3) + \bar{f}_3) \cdot ((\bar{I}_2 \cdot f_4) + \bar{f}_4)] + \\ [((I_1 \cdot f_5) + \bar{f}_5) \cdot ((\bar{I}_1 \cdot f_6) + \bar{f}_6) \cdot ((I_2 \cdot f_7) + \bar{f}_7) \cdot ((\bar{I}_2 \cdot f_8) + \bar{f}_8)]$$

where for:
fuse blown, $f = 0$
fuse not blown, $f = 1$

Given enough products, the sum of the products can express all boolean transfer functions.

Logic is generally defined by logic diagrams and truth tables, rather than the cumbersome equation shown above. For this reason the form used to describe the subject invention is also a logic diagram. But rather than the logic diagram of FIG. 2, a more convenient symbology is used.

Figure 3A:
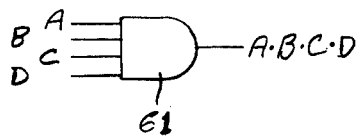
FIG. 3A is a conventional schematic diagram representing an AND gate with four inputs.
Figure 3B:
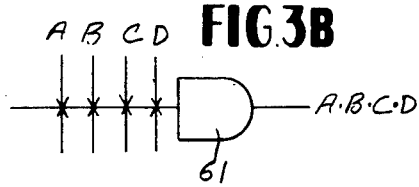
FIG. 3B shows the same AND gate of FIG. 3A in a new symbology.
Figure 3C:
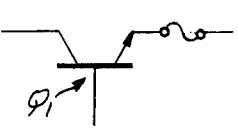
FIG. 3C illustrates schematically the fusible connection used in a programmable array.

FIG. 3A shows the conventional way of schematically representing four inputs, A-D, to an AND gate 61. FIG. 3B shown the same AND gate 60, with the same four inputs A-D, in the new symbology which is used hereafter. The "x" represents a transistor $Q_1$ and a fuse as shown in FIG. 3C, with the base of transistor $Q_1$ connected to an input line 34, the collector to the circuit supply voltage, and the emitter and fuse to the AND gates. If the fuse is blown, then there is no "x". In other words, the existence of an "x" indicates that the input 13 provided to an AND gate; and the absence of an "x" indicates the contrary.

Figure 4:
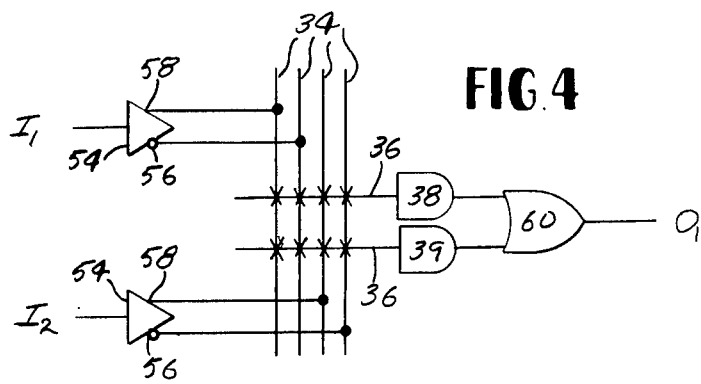
FIG. 4 illustrates in the new symbology the AND gate circuit of FIG. 2.

FIG. 4 shows the same circuit of FIG. 2 drawn in the new symbology, where all of the fuses are intact.

To illustrate the way PAL circuit 30 is programmed, an illustration is provided, using the partial PAL circuit of FIG. 4 as an example. Let us assume that the desired transfer function is:

$$O_1 = I_1 \cdot \bar{I}_2 + \bar{I}_1 \cdot I_2$$

Figure 5A:
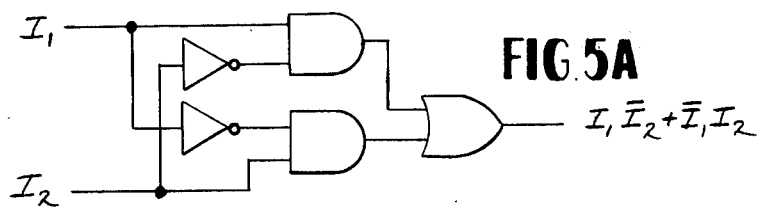
FIG. 5A is a logic circuit diagram for a particular transfer function.
Figure 5B:
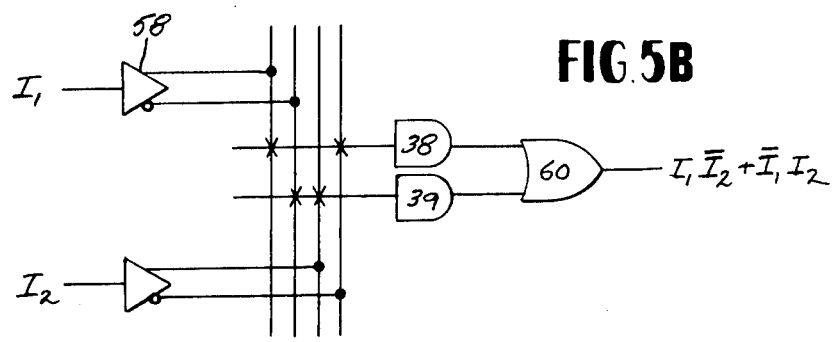
FIG. 5B is a programmed version of the circuit of FIG. 4 to provide the transfer function of FIG. 5A.

The logic circuit diagram for this transfer function is illustrated in FIG. 5A. FIG. 5B is a programmed version of FIG. 4 to provide this transfer function.

The uncompleted PAL 30 of FIG. 1 can be completed to configure a family of PALs having a variety of ratios of inputs to outputs, and either an OR or NOR output. FIGS. 6A-6I show the basic PAL 30 structure of FIG. 1 in a variety of configurations. Each of these configurations is made by the IC fabricator, as opposed to the circuit designer. In other words, the differences between each of the circuits of FIGS. 6A-6I is not normally field programmable. For purposes of clarity the "x's" indicating a fused connection between the input lines 34 and the AND gate inputs 36 are omitted. To help explain FIGS. 6A-6I, reference is made to the first nine entries of Table I:

TABLE I
PAL FAMILY

| Fig No. | No. Input | No. Output | No. I/O | Output Type | XOR | Product Terms/ Output | Number of Product Term | No. Fuses |
|---|---|---|---|---|---|---|---|---|
| 6A | 10 | 8 | — | NOR | — | 2 | 16 | 320 |
| 6B | 10 | 8 | — | OR | — | 2 | 16 | 320 |
| 6C | 12 | 6 | — | NOR | 2,4 | 16 | 384 | |
| 6D | 12 | 6 | — | OR | — | 2,4 | 16 | 384 |
| 6E | 14 | 4 | — | NOR | — | 4 | 16 | 448 |
| 6F | 14 | 4 | — | OR | — | 4 | 16 | 448 |
| 6G | 16 | 2 | — | NOR | — | 8 | 16 | 512 |
| 6H | 16 | 2 | — | OR | — | 8 | 16 | 512 |
| 6I | 16 | 2 | — | OR/NOR | — | 16 | 16 | 512 |
| 10A | 10 | 2 | 6 | NOR | — | 8 | 64 | 2048 |
| 10B | 8 | 4 | 4 | NOR | — | 8 | 64 | 2048 |
| 10C | 8 | 6 | 2 | NOR | — | 6 | 64 | 2048 |
| 10D | 8 | 8 | — | NOR | — | 8 | 64 | 2048 |

Figure 6A:
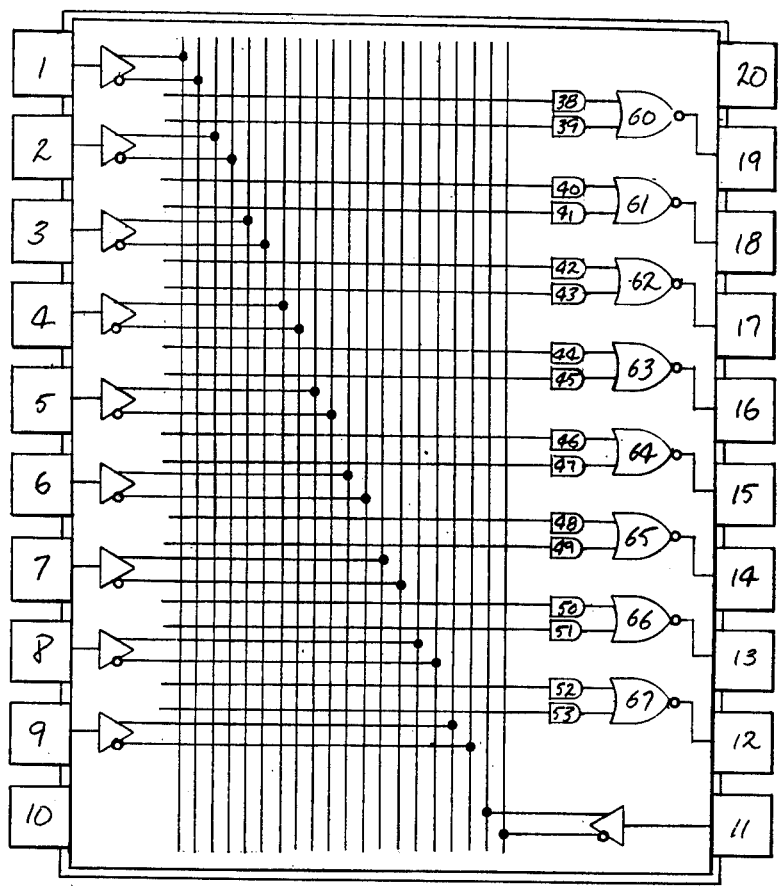
Figure 6B:
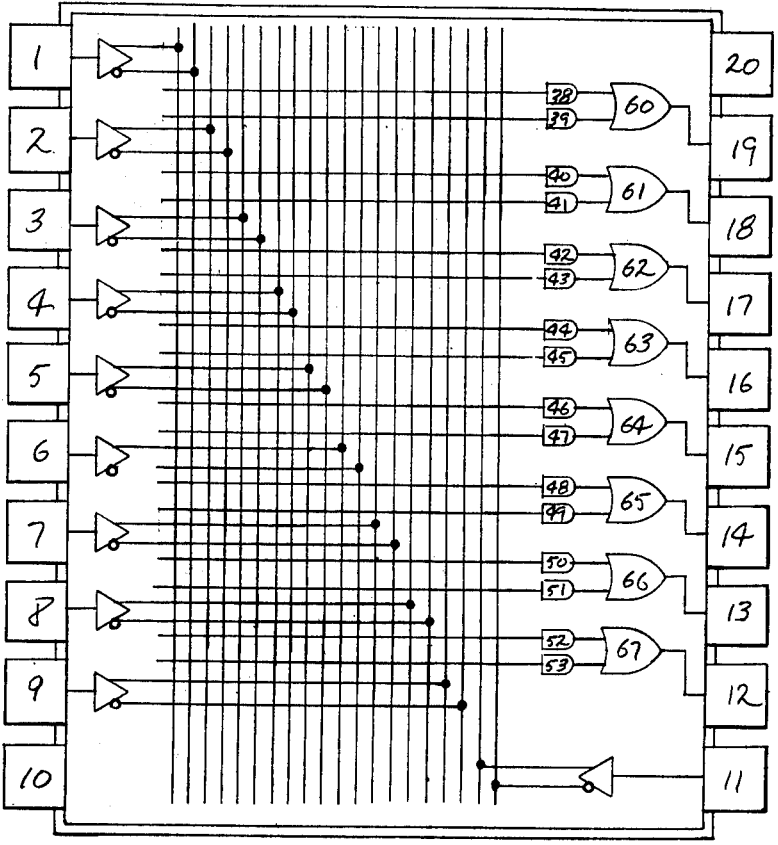

For example the circuit of FIG. 6A has ten inputs, pins 1-9, and 11. It has eight outputs, pins 12-19. There are 16 AND gates giving a total of 16 product terms, or 2 product terms per output. The fuses, not shown, total 320. Each NOR gate has a circle at its output end. This indicates that the OR gate output is inverted by an inverter (not shown). This results in NOR outputs for this cirucit. FIG. 6B is the same configuration as 6A except it has OR outputs.

Figure 6C:
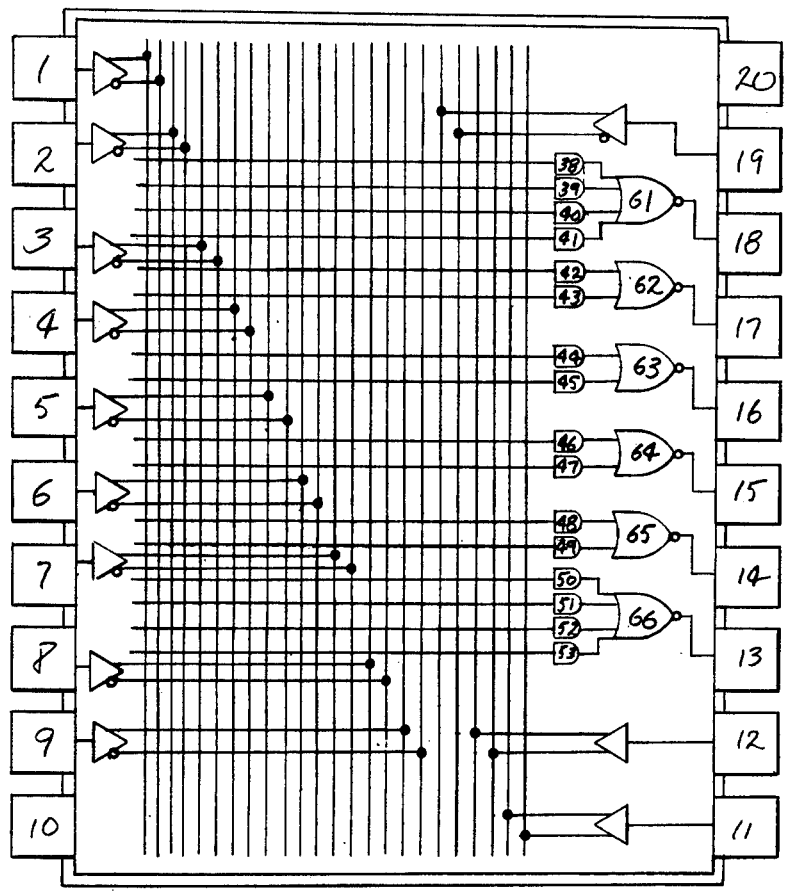
Figure 6D:
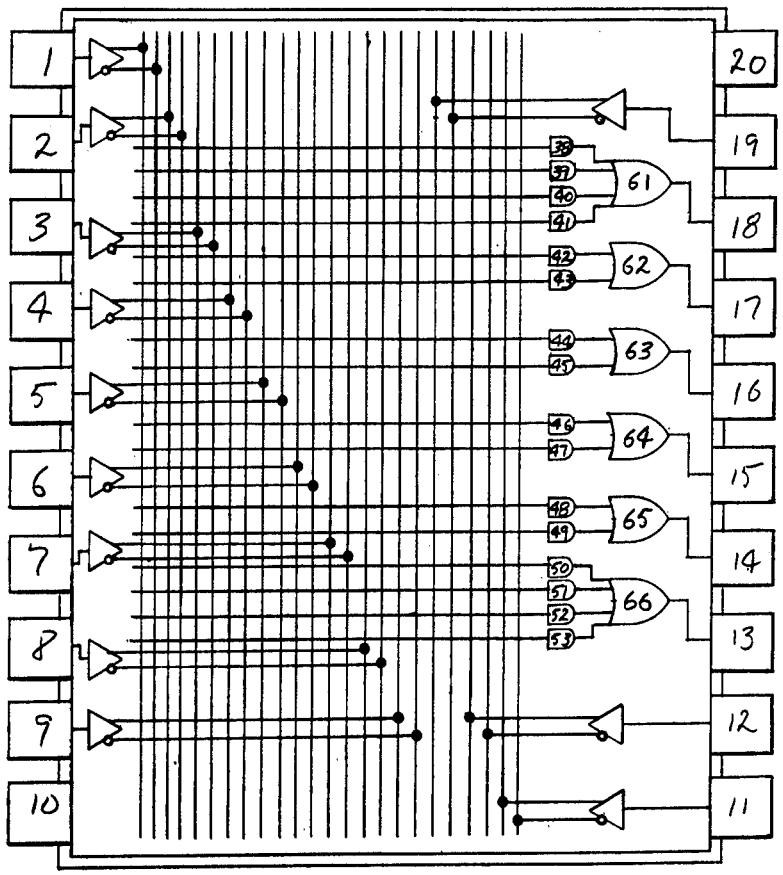

FIGS. 6C and 6D are identical except the former has NOR outputs and the latter OR outputs. In both there are 12 inputs: pins 1-9, 11-12; and six outputs: pins 13-18. Gates 61 and 66 have four AND gate inputs; the rest have two.

Figure 6E:
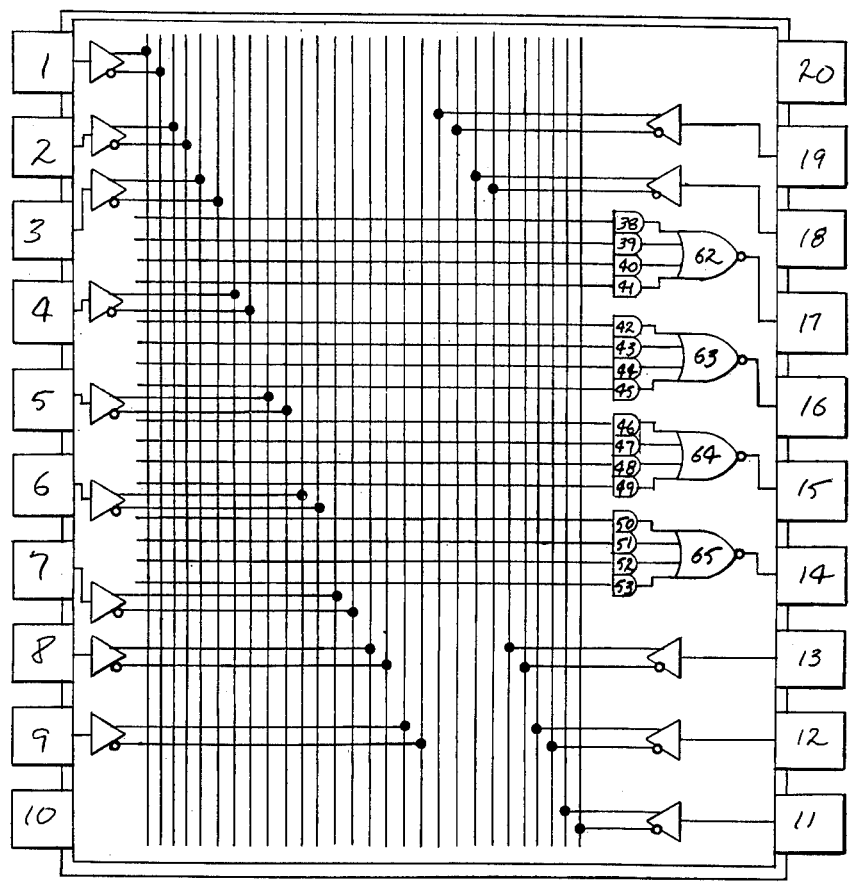
Figure 6F:
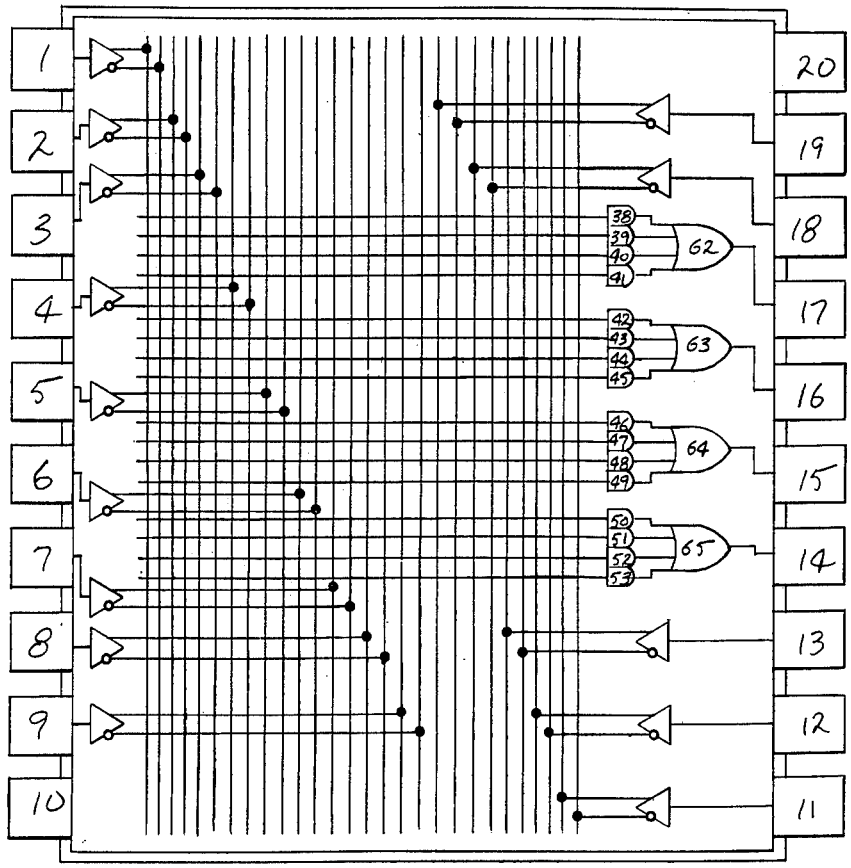

FIGS. 6E and 6F are identical except the former has NOR outputs and the latter OR outputs. Both have 14 inputs, pins 1-9, 11-13, and 18-19; and both have 4 outputs, pins 14-17.

Figure 6G:
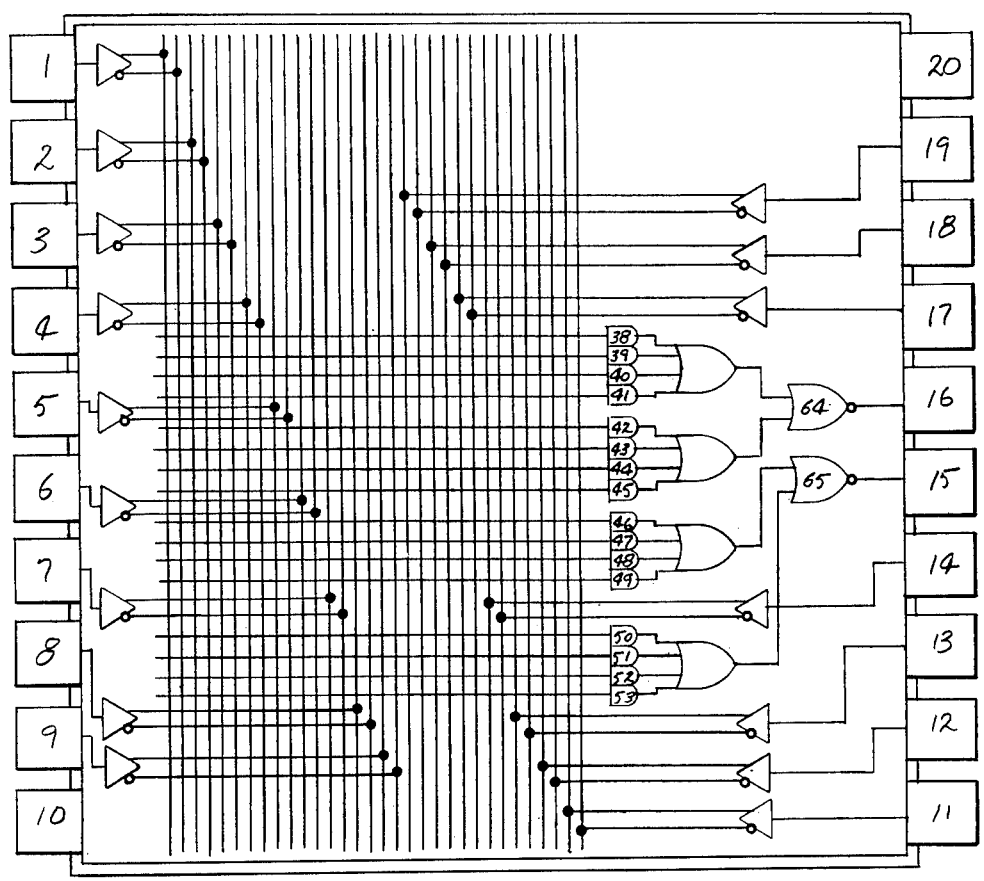
Figure 6H:
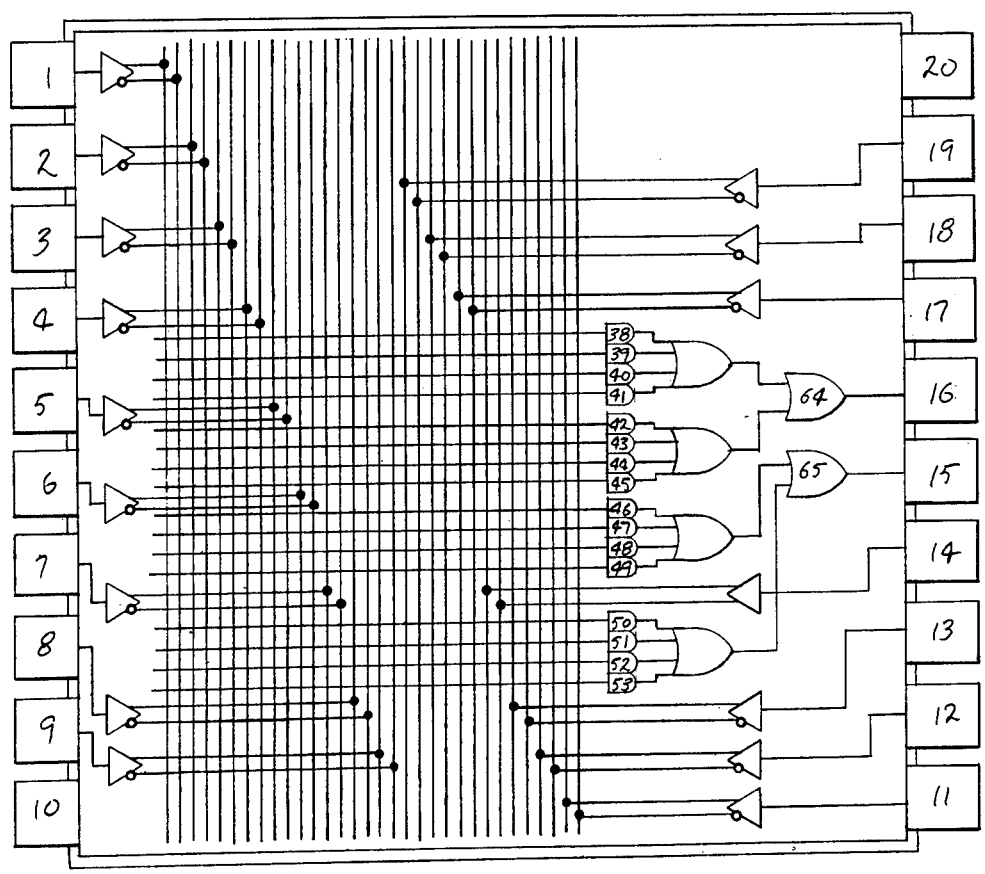
Figure 61:
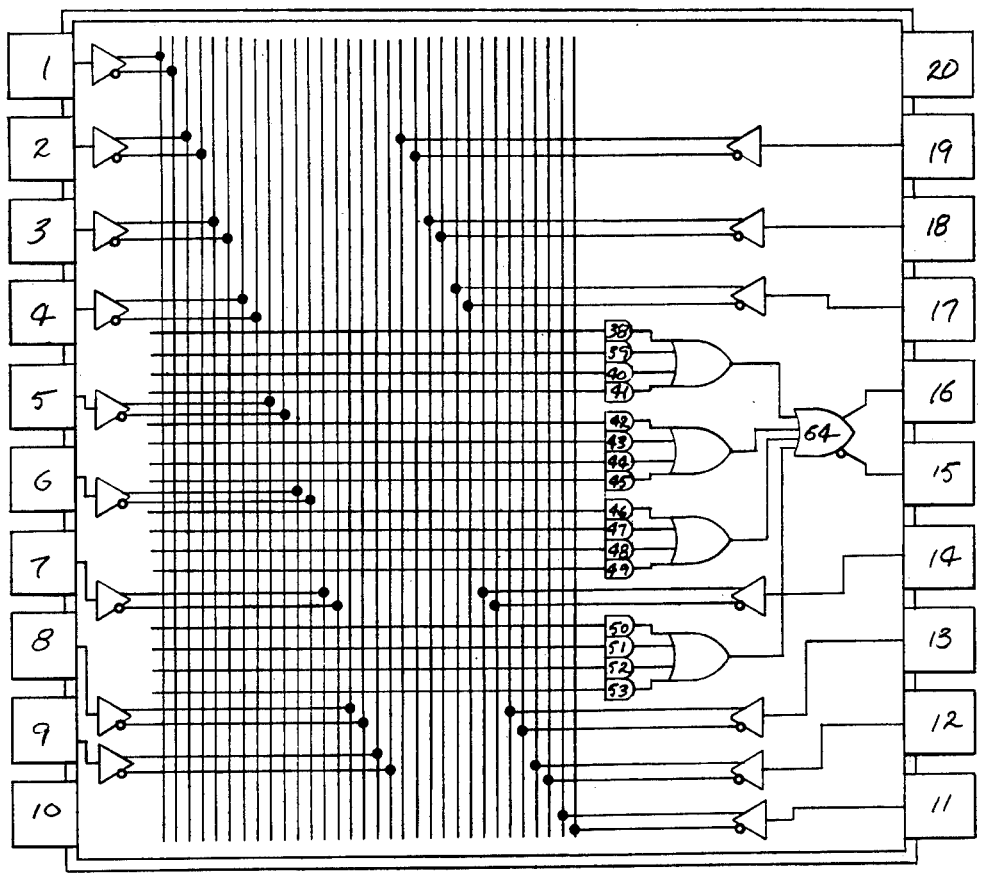

FIGS. 6G and 6H are identical except the former has NOR outputs and the latter OR outputs. Both have 16 inputs, pins 1-9, 11-14, and 17-19; and both have 2 outputs, pins 15-16. Note that the outputs are NOR(OR) gates 64 and 65. OR gate 64 has AND gates 38-45 as inputs and OR gate 65 has AND gates 46-53 as inputs. For convenience in illustrating this schematically, four extra OR gates (not numbered) are shown as inputs to OR gates 64 and 65. In fact these extra four OR gates do not exist physically; but logically the two are equivalent.

FIG. 6I has a single OR gate 64. An OR output is provided at pin 16 and a NOR at pin 15. There are 16 inputs.

In FIGS. 6A-6I, pin 20 is reserved for the circuit voltage supply, Vcc, and pin 10 is used for ground.

Figure 7:
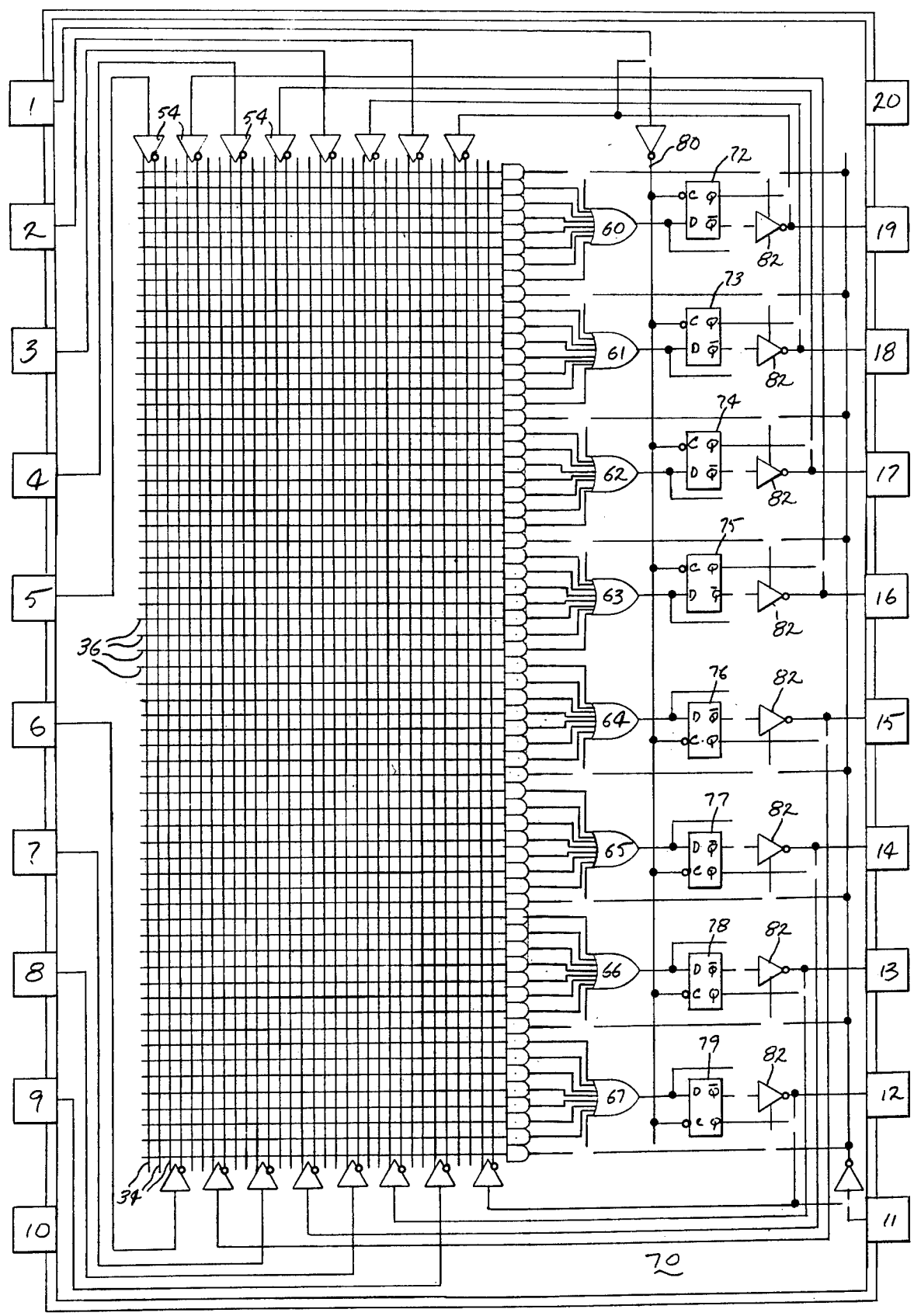
FIG. 7 is a schematic diagram of another uncompleted PAL circuit configuration.

FIG. 7 is a schematic diagram of another PAL circuit configuration 70 and like FIG. 1, is not programmed and, is not completed. FIGS. 10A-10D, also identified in Table I, show completed circuit configurations of the PAL circuit 70, which are subsequently described.

In addition to the AND and OR gates of PAL 30 of FIGS. 1 and 6A-6I, PAL 70 includes series D-type registers 72-79 which temporarily store the output of OR gates 60-67. This is shown in the completed circuits of FIGS. 10B-10D. It is also shown in an isolated schematic of one OR gate 67 in FIG. 8.

Figure 8:
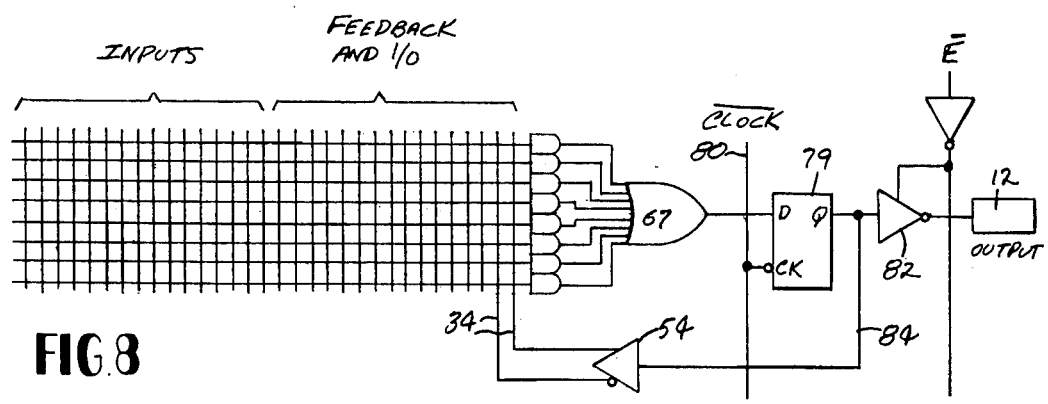
FIG. 8 is a schematic diagram of a part of the PAL circuit of FIG. 7.

Referring to FIGS. 7 and 8, each register, such as register 79, loads its sum of products on the rising edge of a clock pulse provided at line 80. The Q output of each register is gated to the output pin through an active low enable three-state buffer 82. Additionally, the Q output of each register 72-79 feeds back through line 84 to the input lines 34 through the drivers 54.

The feedback arrangement shown in FIG. 8, in combination with register 72-79, forms a state sequencer which can be programmed to execute elementary sequences, such as count up, count down, shift, skip, and branch. Random control sequences, as with state sequencing, are efficiently performed by PAL 70.

Figure 10A:
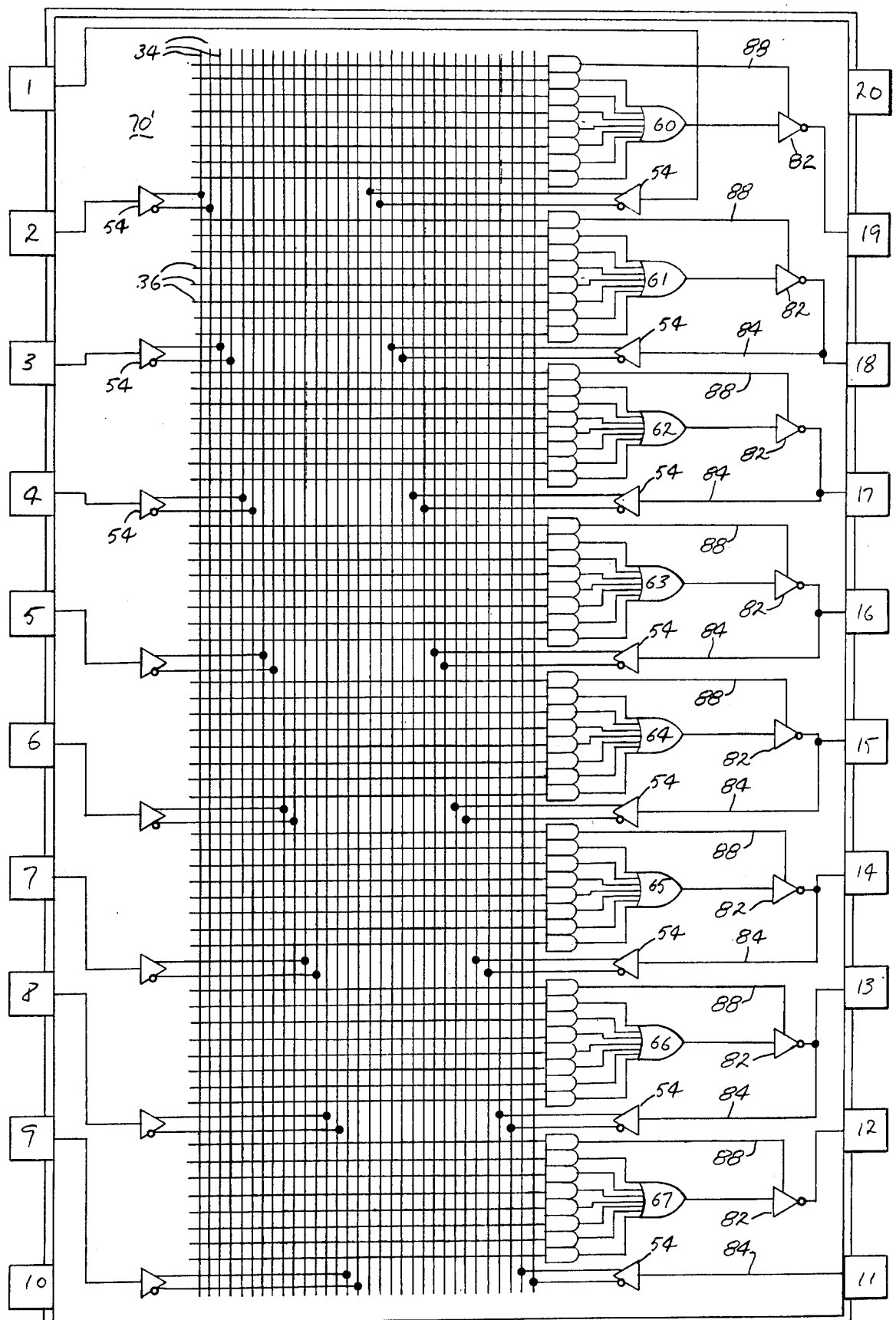
FIGS. 10A-10D show the uncompleted PAL circuit of FIG. 7 in a variety of configurations.
Figure 10B:
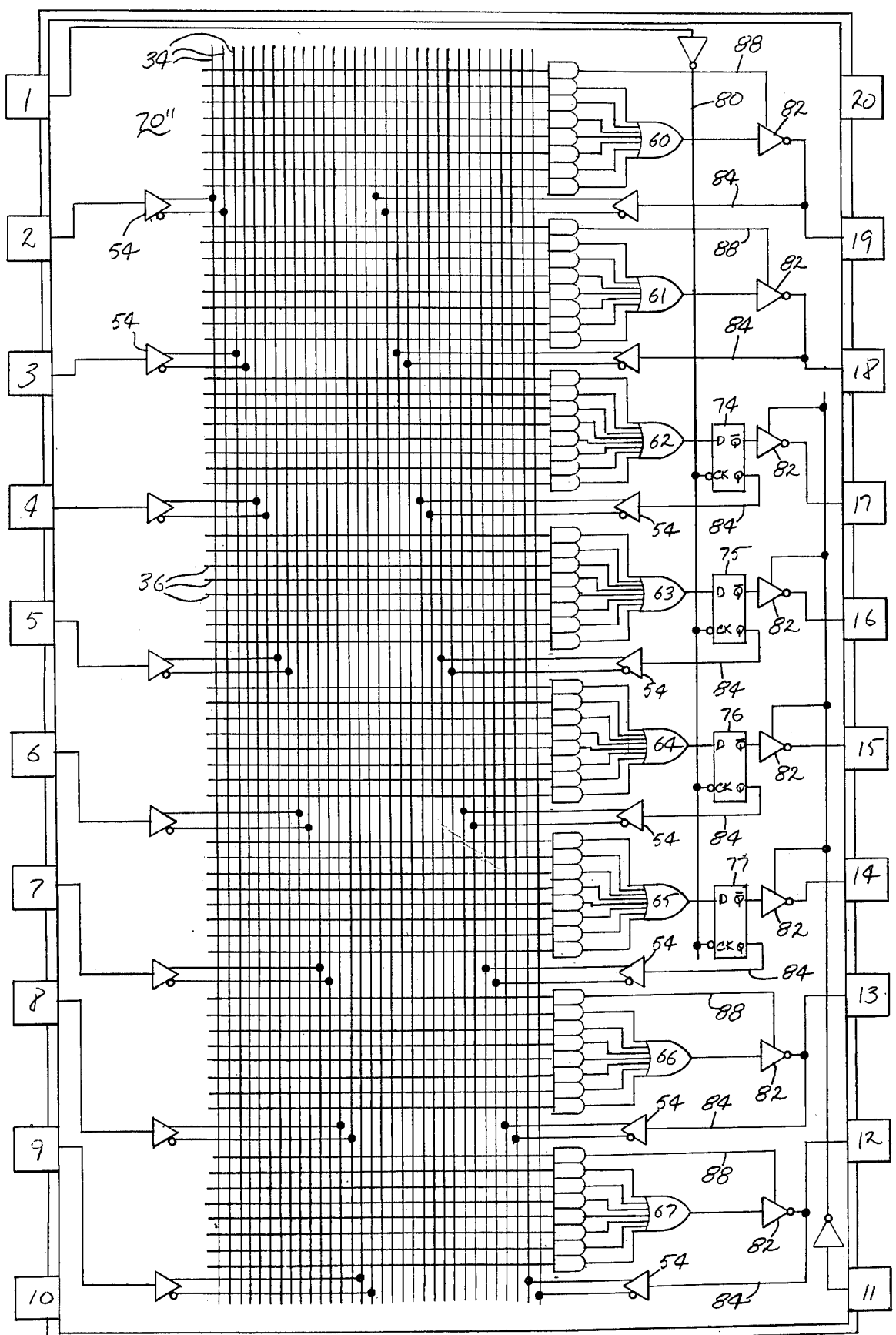
Figure 10C:
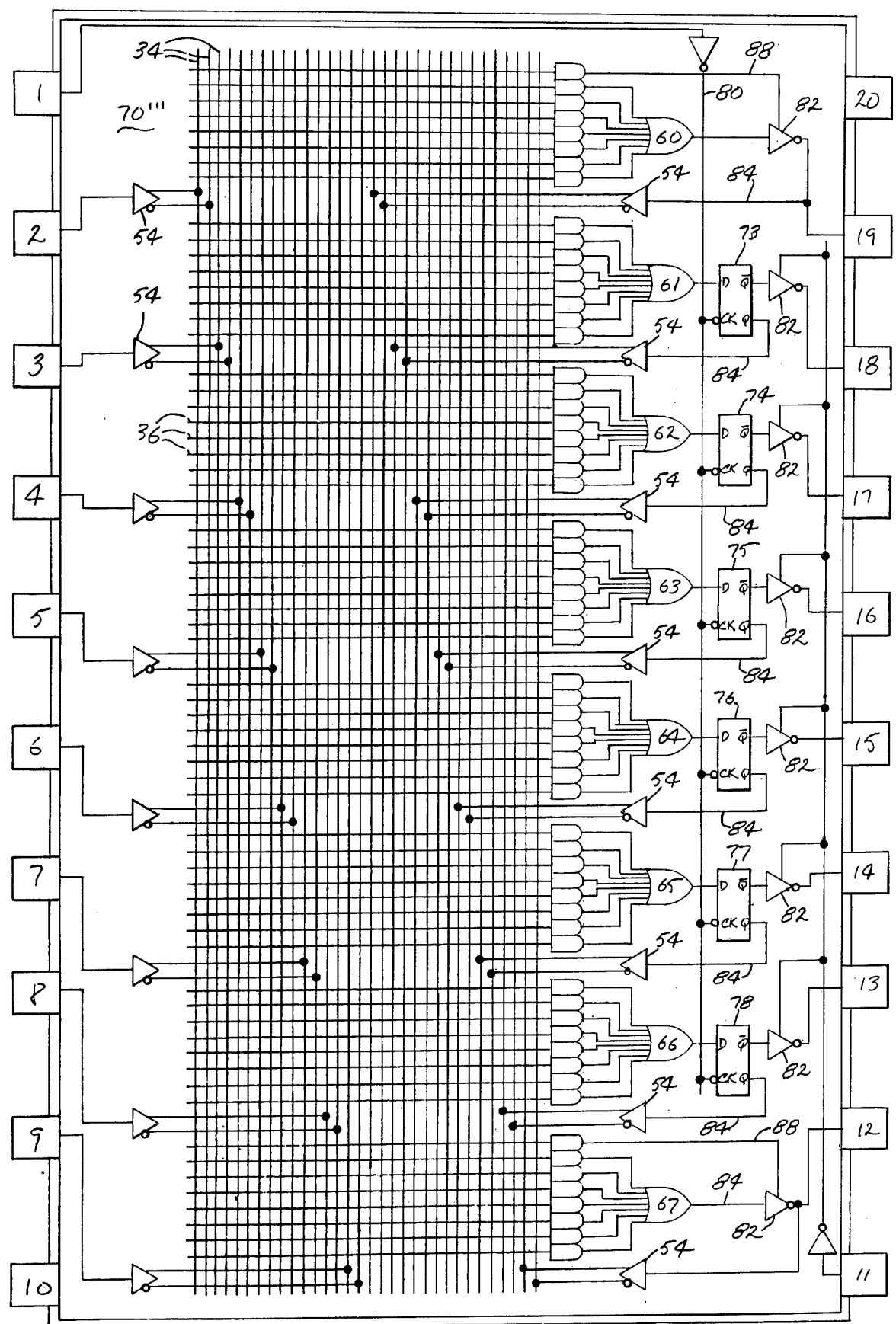
Figure 10D:
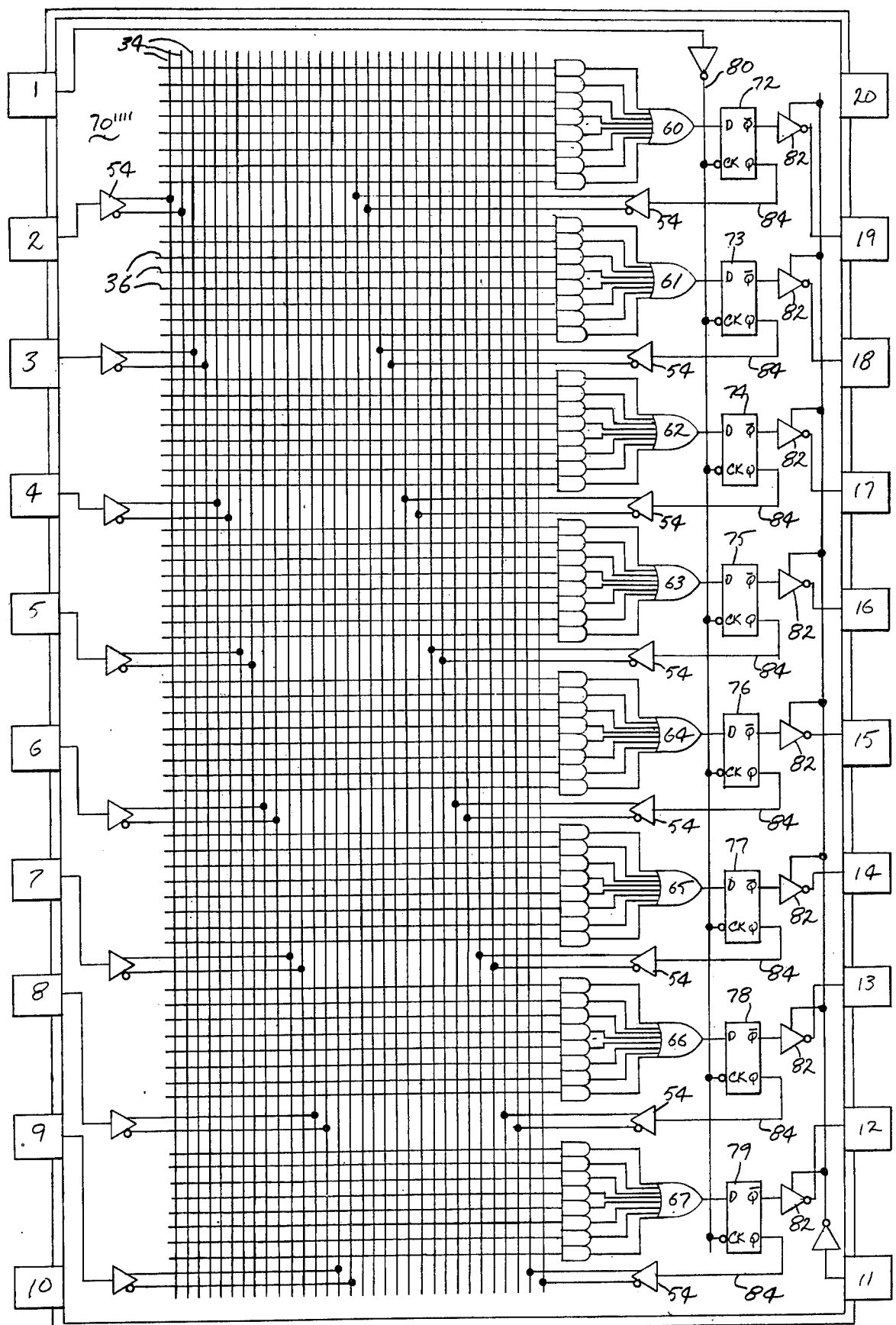

Referring to the PAL 70" circuit of FIG. 10B and Table I, four registers 74-77 are utilized, each being internally fed back via line 84 to the input lines 34. In the PAL 70''' circuit of FIG. 10C, six registers 73-78 are utilized. And in the PAL 70'''' circuit of FIG. 10D, all eight registers are utilized.

PAL 70 of FIG. 7 can also be configured to provide the designer with the option of (1) feeding back the sum from an OR gate while at the same time providing an output at the output pin, or (2) disengaging the OR gate from the output pin, and permitting another input into the AND gate array, at the expense of an output pin. This is shown in the completed circuits of FIGS. 10A, 10B, and 10C. It is also shown in an isolated schematic of one OR gate 67 in FIG. 9, which is now described.

Figure 9:
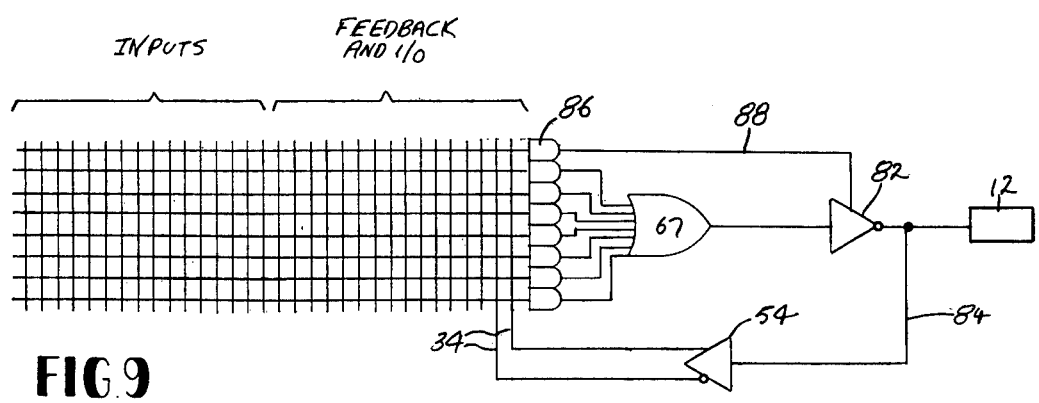
FIG. 9 is a schematic diagram of another part of the PAL circuit of FIG. 7.

In FIG. 9 where one of the product terms, AND gate 86, is used to directly control the three state buffer 82, via line 88, to gate the sum of the products from OR gate 67 to the output pin 12. When the gate 82 is "on", i.e. OR gate 67 is enabled, the output from OR gate 67 is provided at pin 12. When gate 82 is "off," i.e. OR gate 67 is disabled, pin 12 can be used as an input pin. In the latter case, an input signal passes from pin 12 via the "feedback" line 84 to the input lines 34.

In the static case, this programmable I/O feature is used to allocate the ratio of input pins to output pins. By "static case", is is meant that gate 82 is permanently driven either "on" or "off" by AND gate 86. In the dynamic case this feature provides a bidirectional pin for operations such as shifting. By "dynamic case" it is meant that gate 82 can be either "on" or "off" depending on the state of AND gate 86.

Referring additionally to Table 10, the I/O feature is provided for all eight OR gates 60-67, pins 12-19, in the PAL 70' circuit of FIG. 10A. The I/O feature is provided for OR gates 60-61 and 66-67, in the PAL 70" circuit of FIG. 10B. These correspond to pins 20, 19, 13 and 12 respectively. In PAL circuit 70''' of FIG. 10C, OR gates 60 and 67 are provided with the I/O feature.

Figure 11:
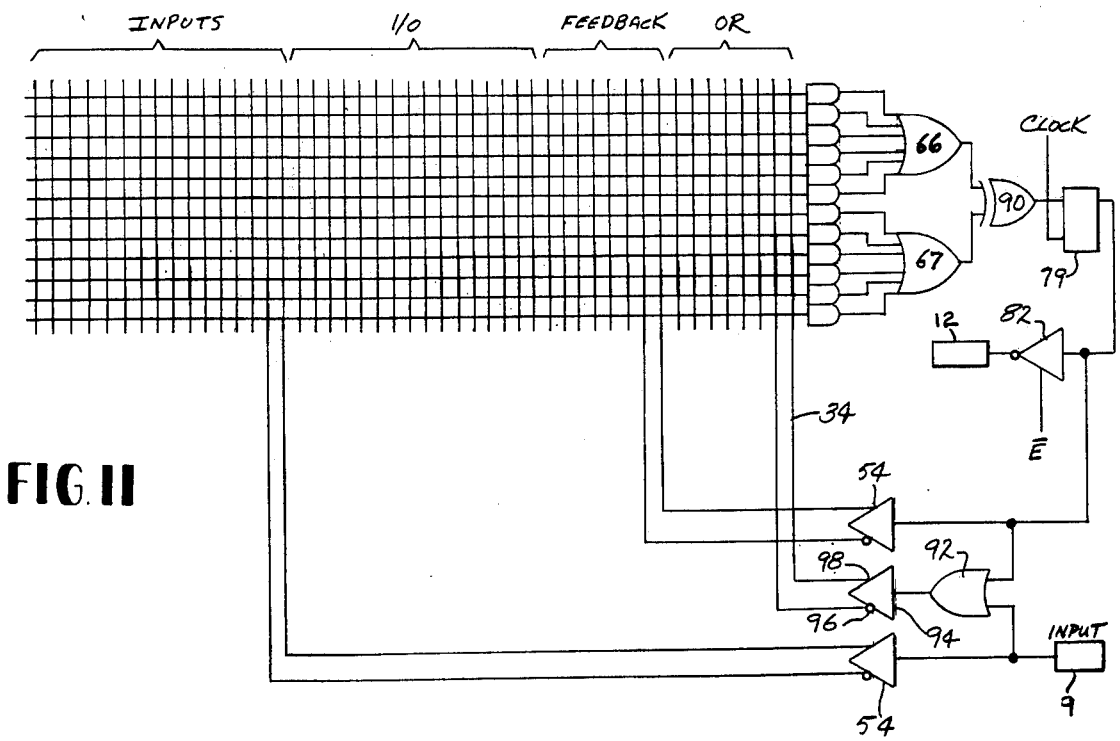
FIG. 11 is a partial PAL circuit with means for doing arithmetic operations.

Another feature of the PAL circuit family is described in FIG. 11. FIG. 11 shows a part of the uncompleted PAL circuit 70 of FIG. 7, namely, a pair of the OR gates 66 and 67. The circuit of FIG. 11, as will be explained, is particularly useful in performing arithmetic operations, such as addition, subtraction, greater than and less than.

FIG. 11 comprises one stage of a multiple stage arithmetic summing circuit. Summing circuits are well known to those skilled in the art and will not be explained at this time. It is sufficient to say that a characteristic of an arithmetic adder is the utilization of exclusive-OR gates and carry circuitry.

Referring to FIG. 11, an exclusive-OR gate is provided between the register 79 and the OR gates 67 and 68. In other words, the output from gates 66 and 67 provides the input to exclusive-OR gate 90.

Also shown in FIG. 11 is the addition of another OR gate 92, which has as its inputs the Q output of register 79 and an input to the PAL circuit. The output of OR gate 92 goes to a driver 94 which, like drivers 54, has an inverted output 96 and a non-inverted output 98. The output from OR gate 94 goes to the AND array via the input lines 34.

It can be shown that in addition to the exclusive-OR function performed by exclusive-OR gate 90, that a combination of AND gates of the AND gate array and OR gates 66 and 67 can additionally function to perform the same logical function as exclusive-OR gate 90. In other words, the combination of the AND array and the OR gate 67 and 68 with the exclusive-OR gate 90 forms a pair of series connected exclusive-OR gates. This combination is the heart of an arithmetic summing circuit.

The addition of the OR gate 92 provides additional logic circuitry necessary for carry look-ahead operations to be formed by each summing stage. Once again, the necessity of the additional OR gates for the carry functions of an adder are known to those skilled in the art and are not herein described.

We claim:

1. A programmable integrated logic circuit array comprising:
    (a) a plurality of groups of logical AND gates;
    (b) a plurality of logical OR gates;
    (c) non-programmable connections between the outputs from all of the AND gates within each of said groups of AND gates to inputs of predetermined and select individual ones of the logical OR gates;
    (d) a matrix of electrical conductor lines comprising
        (i) input lines, and
        (ii) AND gate input lines for each of the AND gates within said plurality of groups of logical AND gates; and
    (e) means for selectively connecting input lines and AND gate input lines to program a desired logical output from said OR gates.

2. A programmable integrated logic circuit array as in claim 1 including register means connected to the output of at least one of said logical OR gates for storing the logical state of the OR gate to which it is connected.

3. A programmable integrated logic circuit array as in claim 2 including means for connecting the output from each of said register means to selected ones of said input lines.

4. A programmable integrated logic circuit array as in claim 1 including gating means connected to the output of at least one of said OR gates, feedback means for connecting the output of each gating means to selected ones of said input lines; and means for gating each of said gating means to either disable or enable said OR gate, said feedback means being operable as an input line when said OR gate is disabled.

5. A programmable integrated logic circuit array as in claim 4 wherein at least one of said gating means is permanently gated to either enable or disable said OR gate.

6. A programmable integrated logic circuit array as in claim 4 wherein at least one of said gating means is temporarily gated to either enable or disable said OR gate.

7. A programmable array of integrated logic circuitry comprising:
    (a) a plurality of AND gates, each AND gate having a plurality of inputs and an output;
    (b) a progrmmable matrix comprising a plurality of input lines and said inputs to said AND gates;
    (c) a plurality of OR gates; and
    (d) non-programmable electrical connections between the outputs of sub-pluralities of said AND gates and predetermined and select individual ones of said OR gates.

8. A programmable integrated logic circuit array as in claim 7 including register means connected to the output of at least one of said logical OR gates for storing the logical state of the OR gate to which it is connected.

9. A programmable integrated logic circuit array as in claim 8 including means for connecting the output from each of said register means to selected ones of said input lines.

10. A programmable integrated logic circuit array as in claim 7 including gating means connected to the output of at least one of said OR gates; feedback means for connecting the output of each gating means to selected ones of said input lines; and means for gating each of said gating means to either disable or enable said OR gate, said feedback means being operable as an input line when said OR gate is disabled.

11. A programmable integrated logic circuit array as in claim 10 wherein each of said gating means is permanently gated to either enable or disable said OR gate.

12. A programmable integrated logic circuit array as in claim 10 wherein each of said gating means is temporarily gated to either enable or disable said OR gate.

13. A programmable integrated logic circuit array comprising:
    (a) a plurality of logical AND gates, each AND gate having a plurality of inputs and an output;
    (b) a matrix comprising the inputs to said logical AND gates and a plurality of input lines;
    (c) means for selectively connecting desired input lines with desired logical AND gate inputs;
    (d) a plurality of logical OR gates;
    (e) non-programmable connections from outputs of specified logical AND gates to inputs of an individual and select OR gate;
    (f) register means connected to the output of at least one of said logical OR gates for storing the logical state of the OR gate to which it is connected.

14. A programmable integrated logic circuit array as in claim 13 including means for connecting the ouput from at least one of said register means to selected ones of said input lines.

15. A programmable integrated logic circuit array as in claim 14 including gating means connected to the output of at least one of said logical OR gates to which a register means is not connected feedback means for connecting the output of each of the gating means to selected ones of said input lines and means for gating each of said gating means to either disable or enable said OR gate, said feedback means being operable as an input line when said OR gate is disabled.

16. A programmable integrated logic circuit array comprising:
   (a) a plurality of logical AND gates, each AND gate having a plurality of inputs and an output;
   (b) a matrix comprising the inputs to said logical AND gates and a plurality of input lines;
   (c) means for selectively connecting desired input lines with desired logical AND gate inputs;
   (d) a plurality of logical OR gates;
   (e) means for connecting outputs from said logical AND gates to inputs to said OR gates;
   (f) gating means connected to the output of at least one of said OR gates;
   (g) feedback means for connecting the output of each of the gating means to selected ones of said input lines; and
   (h) means for gating each of said gating means to either disable or enable said OR gate; said feedback means being operable as an input line when said OR gate is disabled.

17. A programmable integrated logic circuit array as in claim 15 wherein at least one of said gating means is permanently gated to either enable or disable said OR gate.

18. A programmable integrated logic circuit array as in claim 16 wherein at least one of said gating means is temporarily gated to either enable or disable said OR gate.

19. A programmable integrated logic circuit array as in claim 16 including register means connected to the output of at least one of said logical OR gates to which a gating means is not connected for storing the logical state of the OR gate to which it is attached.

20. A programmable integrated logic circuit array as in claim 19 including means for connecting the output of each of said register means to selected input lines.

21. A programmable integrated logic circuit array for performing arithmetic operations, comprising:
   (a) a plurality of logical AND gates, each AND gate having a plurality of inputs and an output;
   (b) a matrix comprising the inputs to said logical AND gates and a plurality of input lines;
   (c) means for selectively connecting desired input lines with desired logical AND gate inputs;
   (d) a plurality of logical OR gates;
   (e) means for connecting outputs from said logical AND gates to inputs of said OR gates;
   (f) a plurality of exclusive-OR gates whose inputs comprise at least a pair of said OR gates;
   (g) register means connected to the outer of at least one of said logical exclusive-OR gates for storing the logical state of the exclusive-OR gate to which it is connected; and
   (h) carry logic circuitry each having a pair of inputs, one input being connected to said register means and one input from an external input for providing carry signal information to said AND gate inputs.

* * * * *

REEXAMINATION CERTIFICATE (671st)
United States Patent [19]
Birkner et al.

[11] B1 4,124,899
[45] Certificate Issued  Apr. 28, 1987

[54] PROGRAMMABLE ARRAY LOGIC CIRCUIT

[75] Inventors: John M. Birkner, Santa Clara; Hua-Thye Chua, Cupertino, both of Calif.

[73] Assignee: Monolithic Memories, Inc., Sunnyvale, Calif.

Reexamination Requests:
No. 90/000,774, May 2, 1985
No. 90/000,934, Jan. 9, 1986

Reexamination Certificate for:
Patent No.: 4,124,899
Issued: Nov. 7, 1978
Appl. No.: 799,509
Filed: May 23, 1977

[51] Int. Cl.$^4$ .............................................. H03K 19/20
[52] U.S. Cl. ................................... 364/716; 307/465
[58] Field of Search ........................ 364/716; 307/465; 340/825.83, 900

[56] References Cited

U.S. PATENT DOCUMENTS

| | | | |
|---|---|---|---|
| 3,514,543 | 11/1970 | Crawford et al. | 340/324 |
| 3,566,153 | 2/1971 | Spencer, Jr. | 307/468 |
| 3,602,733 | 8/1971 | Aoki | 307/209 |
| 3,702,985 | 11/1972 | Probsting | 340/166 R |
| 3,774,171 | 11/1973 | Regitz | 365/105 |
| 3,792,292 | 2/1974 | Priel | 307/209 |
| 3,803,587 | 4/1974 | Mead | 340/336 |
| 3,816,725 | 6/1974 | Greer | 364/716 |
| 3,818,252 | 6/1974 | Chiba et al. | 307/303 |
| 3,818,452 | 6/1974 | Greer | 340/825.83 |
| 3,849,638 | 11/1974 | Greer | 364/716 |
| 3,906,255 | 9/1975 | Mensch, Jr. | 307/448 |
| 3,912,947 | 10/1975 | Buchanan | 307/269 |
| 3,924,243 | 12/1975 | Vermeulen | 364/900 |
| 3,936,812 | 2/1976 | Cox et al. | 364/716 |
| 3,949,370 | 4/1976 | Reyling, Jr. et al. | 364/900 |
| 3,974,366 | 8/1976 | Hebenstreit | 364/716 |
| 3,979,730 | 9/1976 | Bennett et al. | 364/200 |
| 3,983,538 | 9/1976 | Jones | 364/716 |
| 3,987,286 | 10/1976 | Muehldorf | 364/716 |
| 4,037,089 | 7/1977 | Horninger | 364/716 |
| 4,041,459 | 8/1977 | Horninger | 340/166 R |
| 4,084,152 | 4/1978 | Long et al. | 340/166 R |
| 4,091,359 | 5/1978 | Rossler | 340/166 R |
| 4,218,740 | 8/1980 | Bennett et al. | 364/200 |

FOREIGN PATENT DOCUMENTS 1444084  7/1976  United Kingdom .

OTHER PUBLICATIONS

Elliott et al, "Array Logic Processing" *IBM Tech. Disclosure Bulletin*, vol. 16, No. 2, Jul. 1973, pp. 586–587.
Fleisher et al., "Reconfigurable Machine" *IBM Tech. Disclosure Bulletin*, vol. 16, No. 10, Mar. 1974, pp. 3342–3344.
Carr et al., *MOS/LSI Design & Application* T. I. Electronic Series, McGraw Hill & Co. 1972, pp. 229–258.
Fleisher et al., "An Introduction to Array Logic" *IBM J. Research & Development*, Mar. 1975, pp. 98–109.
Jones "Array Logic Macros" *IBM J. Research & Development*, Mar. 1975, pp. 120–126.
Boysel, "Memory on a Chip: A Step Toward Large-scale Integration" *Electronics*, Feb. 6, 1967, pp. 93–97.
Wilkes et al, "The Design of the Control Unit of an Electronic Digital Computer" *The Institution of Electrical Engineers*, Jun. 1957, pp. 121–128.
Mrazek, "PLAs Replace ROMs for Logic Designs" *Electronic Design*, Oct. 25, 1973, pp. 66–70.
Howley et al., "Programmable Logic Array Decoding Technique" *IBM Tech. Disclosure Bulletin*, vol. 17, No. 10, Mar. 1975, p. 2988.
Andres, "MOS Programmable Logic Arrays" *A Texas Instruments Application Report*, Oct. 1970, pp. 1–13.
Barna et al., *Integrated Circuits in Digital Electronics*, John Wiley & Sons 1973, pp. 412–419, & 84–91 & FIG. 11-34.
Cavlan et al., "Field PLAs Simplify Logic Designs", Reprinted from *Electronic Design*, Sep. 1, 1975.
Hemel, "The PLA: A 'different kind' of ROM" *Electronic Design*, Jan. 5, 1976, pp. 78–84.
Wood, "High-Speed Dynamic Programmable Logic Array Chip" *IBM J. Res. Develop.*, Jul. 1975, pp. 379–381.
Fairchild F-8 Microprocessor, late '74.
*Signetics Bipolar & MOS Memory*, Data Manual Signetics Inc, pp. 156–165, Jan. 1979.
Derman, "PLAs or MPs? at times they compete & at other times they cooperate" *Electronic Design*, 18, Sep. 1, 1976, pp. 24–30.
*Macworld*, The Macintosh Magazine, May–Jun. 1984.
Kidder, *The Soul of a New Machine*, 1982, pp. 118–123 & 268–269.
National Semiconductor Inc., "Data Update Nos. 86 & 87", Aug. 1972.
Blakeslee, *"Digital Design with Standard MSI & LSI"*, John Wiley & Sons, 1975, pp. 67–77, 94–99 & 104–105.
*PAL Handbook*, Monolithic Memories Inc. 1978.
Hutton et al, "A Simplified Summation Array for Cellular Logic Modules" *IEEE Trans. on Computers*, Feb. 1974, pp. 203–206.
*Programmable Logic–A Basic Guide for the Designer*, Data I/O Corp. 1983, pp. 20–25.

(List continued on next page.)

Primary Examiner—David H. Malzahn

[57] ABSTRACT

Programmable array logic circuitry is disclosed wherein the outputs from a field programmable AND gate array are connected, non-programmably, to specified OR gates. For greater architectural and operational flexibility, registered outputs, internal feedback to the AND gate array, input/output pin interchangeability, and means for allowing performance of arithmetical, as well as logic, operations are provided.

OTHER PUBLICATIONS

*IBM's Technical Reference Manual* for the IBM PC-XT #6936808 Appendix D, pp. D2-D4, Apr. 1983.

*Apple II Reference Manual* #A2L0001A, p. 110, FIG. 22-1, 1981.

*The TTL Data Book for Design Engineers,* Texas Instruments Inc., 1973, pp. 295, 303, 473, 458 & 480.

Ramaswamy et al., "Second Generation PAL Programmers", *Wescon/83 Professional Program Session Record,* Session 13.

Monolithic Memories Inc., Form 10-K, Oct. 3, 1982, Annual Report Pursuant to Section 13 or 15(d) of the Securities Exchange Act of 1934.

The Role of Software in the Growth of PLDs, *The Technology Research Group Letter,* vol. 1, No. 13, Nov. 1985, p. 3.

Teel et al, "A Logic Minimizer For VLSI PLA Design" *ACM IEEE Nineteenth Design Automation Conf. Proceedings,* Jun. '82, pp. 156–162.

Marrin, "Programmable Logic Devices Gain Software Support", EDN, Feb. 9, 1984, pp. 67–74.

Coli et al., "Next Generation Programmable Logic" *Wescon/84, Professional Program Session Record,* Session 19.

Monolithic Memories Annual Report 1981, Letter to Shareholders, p. 2.

"Semicustom IC Update, Field Programmable Logic Devices" *Vien From the Valley,* Hambrecht & Quist Inc., vol. 3, No. 1, Mar. '86, pp. 4–7.

Phelps, Institutional Research Report on Monolithic Memories, Inc. A Publication of Woodman, Kirkpatrick & Gilbreath, Aug. 30, 1984.

Cavlan et al., "FPLA Applications–Exploring Design Problems and Solutions" pp. 63–69.

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 4–6, 10–12 & 15–21 is confirmed.

Claims 1–3, 7–9 and 13–14 are cancelled.

* * * * *

REEXAMINATION CERTIFICATE (1034th)
United States Patent [19]

[11] B2 4,124,899

Birkner et al.

[45] Certificate Issued Apr. 18, 1989

[54] PROGRAMMABLE ARRAY LOGIC CIRCUIT

[75] Inventors: John M. Birkner, Santa Clara; Hua-Thye Chua, Cupertino, both of Calif.

[73] Assignee: Monolithic Memories, Inc., Sunnyvale, Calif.

Reexamination Request:
No. 90/001,527, Jun. 16, 1988

Reexamination Certificate for:
Patent No.: 4,124,899
Issued: Nov. 7, 1978
Appl. No.: 799,509
Filed: May 23, 1977

Reexamination Certificate B1 4,124,899 issued Apr. 28, 1987.

[51] Int. Cl.⁴ .............................................. H03K 19/20
[52] U.S. Cl. ..................................... 364/716; 307/465
[58] Field of Search ................. 364/716, 900; 307/465; 340/825.83

[56] References Cited

U.S. PATENT DOCUMENTS

| | | | |
|---|---|---|---|
| 3,191,751 | 6/1965 | Price | 340/166 |
| 3,505,535 | 4/1970 | Cavaliere | 307/203 |
| 3,566,153 | 2/1971 | Spencer, Jr. | 307/205 |
| 3,601,629 | 8/1971 | Cricchi | 307/205 |
| 3,641,511 | 2/1972 | Cricchi et al. | 340/173 R |
| 3,679,915 | 7/1972 | Kriger | 307/289 |
| 3,740,590 | 6/1973 | Hart et al. | 307/289 |
| 3,906,255 | 9/1975 | Mensch, Jr. | 307/448 |
| 3,935,476 | 1/1976 | Paluck | 307/213 |
| 3,936,812 | 2/1976 | Cox et al. | 340/173 R |
| 4,041,459 | 8/1977 | Horninger | 340/166 R |
| 4,074,355 | 2/1978 | Tubbs | 364/200 |
| 4,177,452 | 12/1979 | Balasubramanian et al. | 340/166 R |
| 4,207,556 | 6/1980 | Sugiyama et al. | 340/166 R |

FOREIGN PATENT DOCUMENTS

1948825 4/1970 Fed. Rep. of Germany .
75-29740 4/1976 France .
48-88837 11/1973 Japan .
847224 9/1960 United Kingdom .

OTHER PUBLICATIONS

Leininger, "Universal Logic Module", *IBM Tech. Disclosure Bulletin*, vol. 13, No. 5, Oct. 1970, pp. 1294–1295.

Stoops et al., "S/C FPLA Engineering Specification", IBM Document #76-M41-006A, Jan. 14, 1977, 15 pages.

*Integrated Diode Matrices* published by Radiation, Inc., Feb. 1969, pp. I-II, 1,3-9, 14, 16, 19-20, 23-25, 28-32, 35, 37, 39-43, 45, 49-50, 52-53, 55-58 & 60-61.

Stoops, "Programmable Architectural Array", *IBM Tech. Disclosure Bulletin*, vol. 19, No. 12, May 1977, p. 4569.

*Signetics Field Programmable Logic Arrays* published by Signetics, Feb. 1976, pp. 3-4.

*Bipolar LSI Data Book* published by Monolithic Memories, Inc. 1978, pp. 7-7, 7-8, 7-9, 7-29, 7-75, & 7-76.

*The TTL Data Book for Design Engineers* published by Texas Instruments, Inc. 1976, pp. 7-437 to 7-442 & 7-349 to 7-350.

*Bipolar Microprocessor Logic and Interface Data Book* published by Advanced Micro Devices, Inc. 1985, pp. 5-1 to 5-5.

Cavlan et al., "Field-PLAs Simplify Logic Designs", *Electronic Design*, Sep. 1, 1975, pp. 84–90.

Derman, "PLAs or μPs? At Times They Compete, and At Other Times They Cooperate", *Electronic Design*, Sep. 1, 1976, pp. 24–30.

Logue et al, "Hardware Implementation of a Small System in Programmable Logic Arrays", *IBM J. Res. & Dev.*, Mar. 1975, pp. 110–119.

Henle et al, "Structured Logic", *AFIPS Conference Proceeding* 1969, vol. 35, pp. 61–67.

Flinders et al, "Functional Memory as a General Purpose Systems Technology", *Proc. of the 1970 IEEE International Computer Group Conference*, pp. 314–324.

Jones et al, "Read-Only Programmable Logic Array with Writable Segment", *IBM Tech. Disclosure Bulletin*, Mar. 1975, p. 2987.

Hernandez et al, "1/N Digital Detector", *IBM Tech. Disclosure Bulletin*, vol. 9, No. 10, Mar. 1967, pp. 1268–1269.

Birkner, "FPLA's When and How to Use Them", Feb. 1976, 5 sheets.

Birkner, "FPLA's: When and How to Use Them" published by Monolithic Memories, Inc., Jun. 1976, 4 pages.

Stoops et al, "S/C FPLA Engineering Specification", IBM Document #76-M41-006C, Mar. 29, 1977, pp. 1–15.

*Primary Examiner*—David H. Malzahn

[57] ABSTRACT

Programmable array logic circuitry is disclosed wherein the outputs from a field programmable AND gate array are connected, non-programmably, to specified OR gates. For greater architectural and operational flexibility, registered outputs, internal feedback to the AND gate array, input/output pin interchangeability, and means for allowing performance of arithmetical, as well as logic, operations are provided.

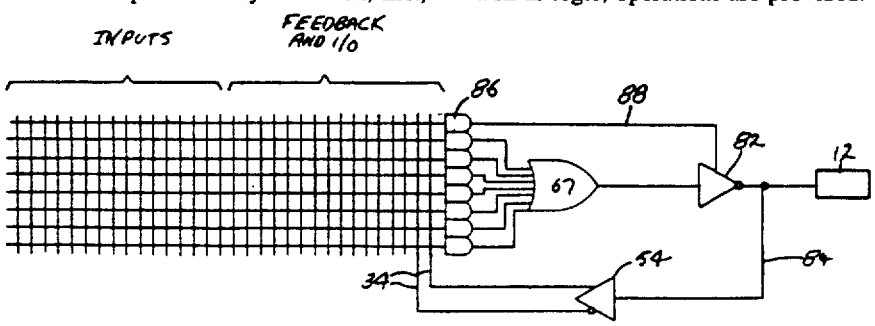

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 4–6, 10–12 and 15–21 is confirmed.

Claims 1–3, 7–9, 13 and 14 were previously cancelled.

* * * * *